United States Patent [19]

Larabell

[11] Patent Number: 5,660,553
[45] Date of Patent: Aug. 26, 1997

[54] BRACKET

[75] Inventor: Henri J. Larabell, San Jose, Calif.

[73] Assignee: HJ&E Engineering, San Jose, Calif.

[21] Appl. No.: 610,044

[22] Filed: Mar. 4, 1996

[51] Int. Cl.[6] .................................................. H01R 13/62
[52] U.S. Cl. ........................................ 439/160; 439/152
[58] Field of Search ............................ 439/152–160, 439/372; 361/796, 797, 798

[56] References Cited

U.S. PATENT DOCUMENTS

| | | | |
|---|---|---|---|
| 3,180,670 | 4/1965 | Pryde | 439/153 |
| 4,694,380 | 9/1987 | Mallory et al. | 439/160 |
| 5,283,713 | 2/1994 | Nagafuji et al. | 439/152 |

*Primary Examiner*—David L. Pirlot
*Attorney, Agent, or Firm*—Peninsula IP Group; Douglas A. Chaikin

[57] ABSTRACT

A bracket for removeably attaching a memory storage device in an equipment slide includes a frame having a face member, a lever and a pair rails. The rails attach to the face member and connect with a memory storage device. The lever rotates to eject the memory storage device from the equipment slide and the lever slides to lock the memory storage device with the equipment slide.

16 Claims, 4 Drawing Sheets

BRACKET

BACKGROUND OF THE INVENTION

1. Field of the Invention

This invention relates to brackets which interconnect memory storage devices with a memory storage device system. More particularly, this invention relates to a memory storage device mounting bracket having a lever to facilitate removal of the bracket from an equipment slide.

2. Previous Art

A host system (e.g. a computer system) often requires memory storage capacity to enable mass storage and access of data, software, etc. In some host systems, the concept of "hot swapping" of memory storage devices has been introduced. "Hot swapping" allows a memory storage device, typically a hard disk, to be removed from or connected to the host system while the host system continues to operate. During "hot swapping", the host system need not be shut down.

A host system typically includes a circuit board which physically attaches to a memory storage device, or a memory storage device controller. The circuit board has a multi-pin connector which electronically connects the memory storage device with the circuit board.

Memory storage device housings have been developed which include equipment slides and memory storage device brackets. The circuit board of the host system physically attaches to the slide. The bracket slides onto the slide to facilitates the rapid installation and removal of the memory storage device into and out of the slide. Accordingly, the bracket and slide align and interconnect memory storage devices with the circuit board of the host system.

One bracket currently known includes a pair of rails, a face and a folding door. The door rotates between open and closed positions. In the open position, the bracket may be inserted into or removed from the slide. In the closed position, the door aligns with the face and locks the bracket with the slide. Both ends of the door lock to hold the memory storage device with the equipment slide.

One disadvantage of this particular type of bracket is that there is no facility for aiding the removal of the memory storage device from the slide. In order to remove the memory storage device, one must grasp the memory storage device and exert considerable force, thereby risking damage to the connectors. Additionally, electrostatic discharge is a possible consequence of this kind of manual handling of memory storage devices. Such electrostatic discharge may endanger the integrity of data stored on the memory storage device. What is desired is a bracket which is easily and safely removed from a slide both physically and electronically.

A bracket manufactured by Sun Microsystems, Inc., for example, includes a pair of rails and a face with a door. Rubber rings seat in each rail to inhibit vibration of the bracket with respect to the slide. When the rails align with and insert into the slide, the rubber rings resist insertion. This resistance also manifests itself when the bracket is to be removed from the slide. What is desired is a bracket which can be easily slid into and out of an equipment slide.

Brackets and slides are often designed having strict tolerances to enable the electrical connection between the memory storage device and multi-pin connector of the host system circuit board. When the bracket does not properly fit in the slide, the bracket may cause the circuit board to flex and cause damage. Alternatively, improper fit between the bracket and slide may fail to properly support the electrical connection between the memory storage device and the host system. This may adversely affect the flow of data through the electrical connectors. What is desired is a bracket which is forgiving and which connects with a slide having inexact tolerances.

SUMMARY OF THE INVENTION

It is an object of the invention to provide an improved bracket which includes a lever which assists in facilitating ejection of the improved bracket from a housing.

It is another object of the invention to provide a bracket which urges a memory storage device against the pin connector of a circuit board to improve the electrical connection between the memory storage device and a host system.

These objects and those mentioned and which will become apparent below are achieved by providing a bracket for removeably attaching a memory storage device to an equipment slide having an electrical connector, comprising:

- a frame attachable to the memory storage device, the frame including a face member, a first rail and a second rail, each rail has one end attached to the face member; and
- a lever rotatably mounted on the face member, the lever has a first end and a second end, the second end urges against the equipment slide to eject the memory storage device from the equipment slide in response to rotation of the lever,
- whereby, when the bracket attaches the memory storage device in the equipment slide and the lever rotates, the lever urges against the equipment slide to eject the memory storage device from the equipment slide.

In a preferred embodiment, the lever slidably mounts on the face member. The first end of the lever locks the bracket with the slide when the lever slides with respect to the face member.

In another preferred embodiment, the memory storage device electronically attaches with the electrical connector and mechanically attaches with the equipment slide. The first end of the lever urges against the equipment slide to stabilize the electrical connection between the memory storage device and the electrical connector.

In another preferred embodiment, the lever slidably mounts on the face member and slides between a first position to a second position. In the first position, the first end of the lever locks the bracket with the equipment slide. In the second position, the first end of the lever unlocks the bracket from the equipment slide.

It is an advantage of the invention to provide an improved bracket which includes a lever which rotates to eject a memory storage device from a housing and which slides to lock the memory storage device in the housing.

It is another advantage of the invention to provide a bracket which urges a memory storage device against a circuit board to stabilize the electrical connection between the memory storage device and the circuit board.

BRIEF DESCRIPTION OF THE DRAWINGS

For a further understanding of the objects and advantages of the present invention, reference should be had to the following Detailed Description of the Invention, taken in conjunction with the accompanying drawing, in which like parts are given like reference numerals and wherein.

DETAILED DESCRIPTION OF THE INVENTION

Figure 1:
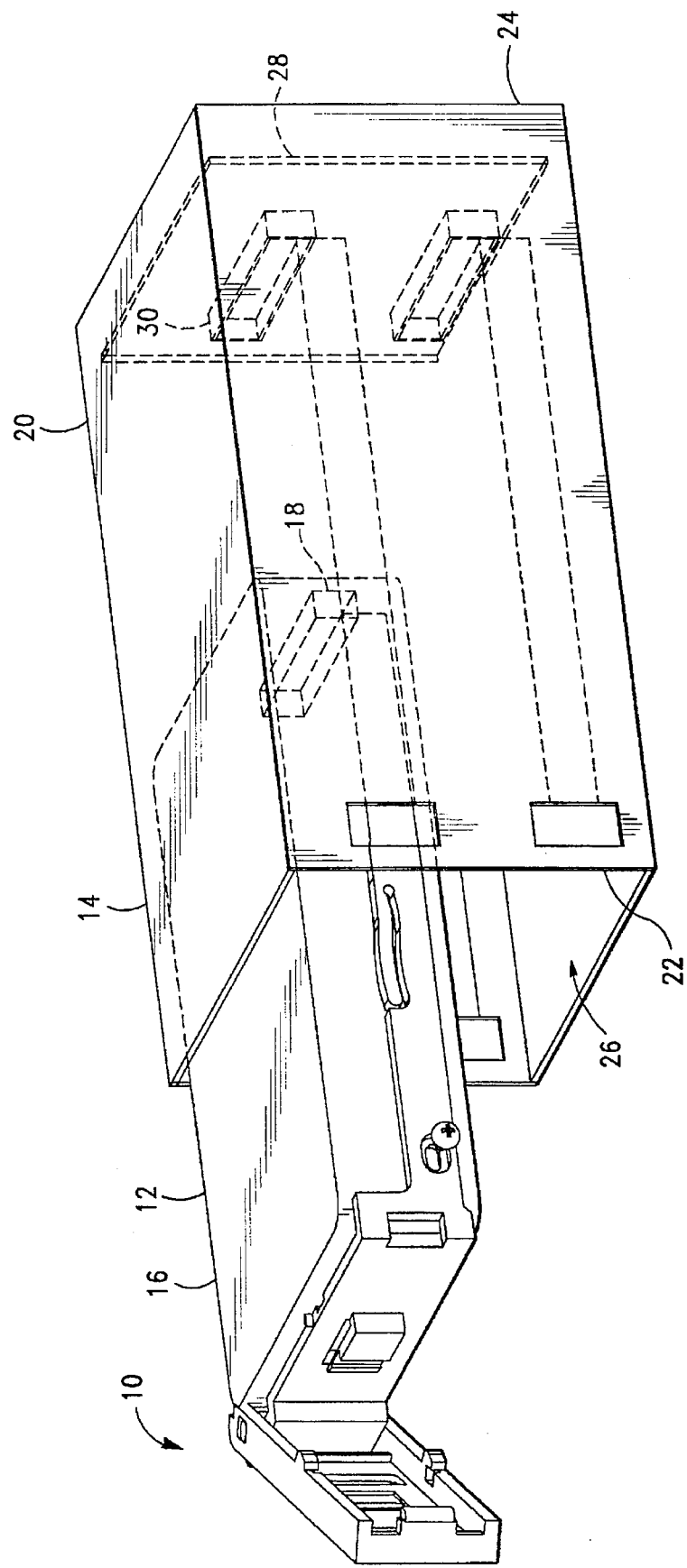
FIG. 1 is a perspective view of the bracket of the present invention sliding into a memory storage device housing having an equipment slide.

With particular reference to FIG. 1, there is shown a bracket generally designated with the reference numeral 10. The bracket 10 removeably attaches a memory storage device 12 to an equipment slide 14. The bracket 10 facilitates hot swapping of the memory storage device 12.

The memory storage device 12 includes a hard disk drive 16. The hard disk drive includes an electrical connector 18. The electrical connector 18 includes an 80 pin SCSI connector for communicating data, power and a SCSI identification numeral between the hard disk drive 16 and a memory storage system. It can be appreciated that, although the memory storage device 12 includes a hard disk drive 16, any of a number of memory storage devices may be attached to the slide 14 in accordance with the present invention. Such devices may be configured with and without SCSI architecture.

A memory storage device housing 20 includes the equipment slide 14. The slide 14 holds at least one memory storage device 12 and electrically connects the memory storage device 12 to a host system such as a computer system. The equipment slide 14 defines a front portion 22 and a rear portion 24. The front portion 22 defines a memory storage device bay which is generally designated with the reference numeral 26. The bay 26 receives memory storage devices. The rear portion 24 has a circuit board 28. The circuit board 28 electrically connects with a host system such as a computer system.

The circuit board 28 includes an electrical connector 30. The electrical connector 30 includes an 80 pin SCSI electrical connector which mates with the connector 18 of the hard disk drive 16.

The bracket 10 and the memory storage device 12 insert into the equipment slide 14. In particular, the bracket 10 inserts through the memory storage device bay 26 and slides along the equipment slide 14 until the connector 18 of the memory storage device 12 mates with the connector 30 of the circuit board 28.

Figure 2:
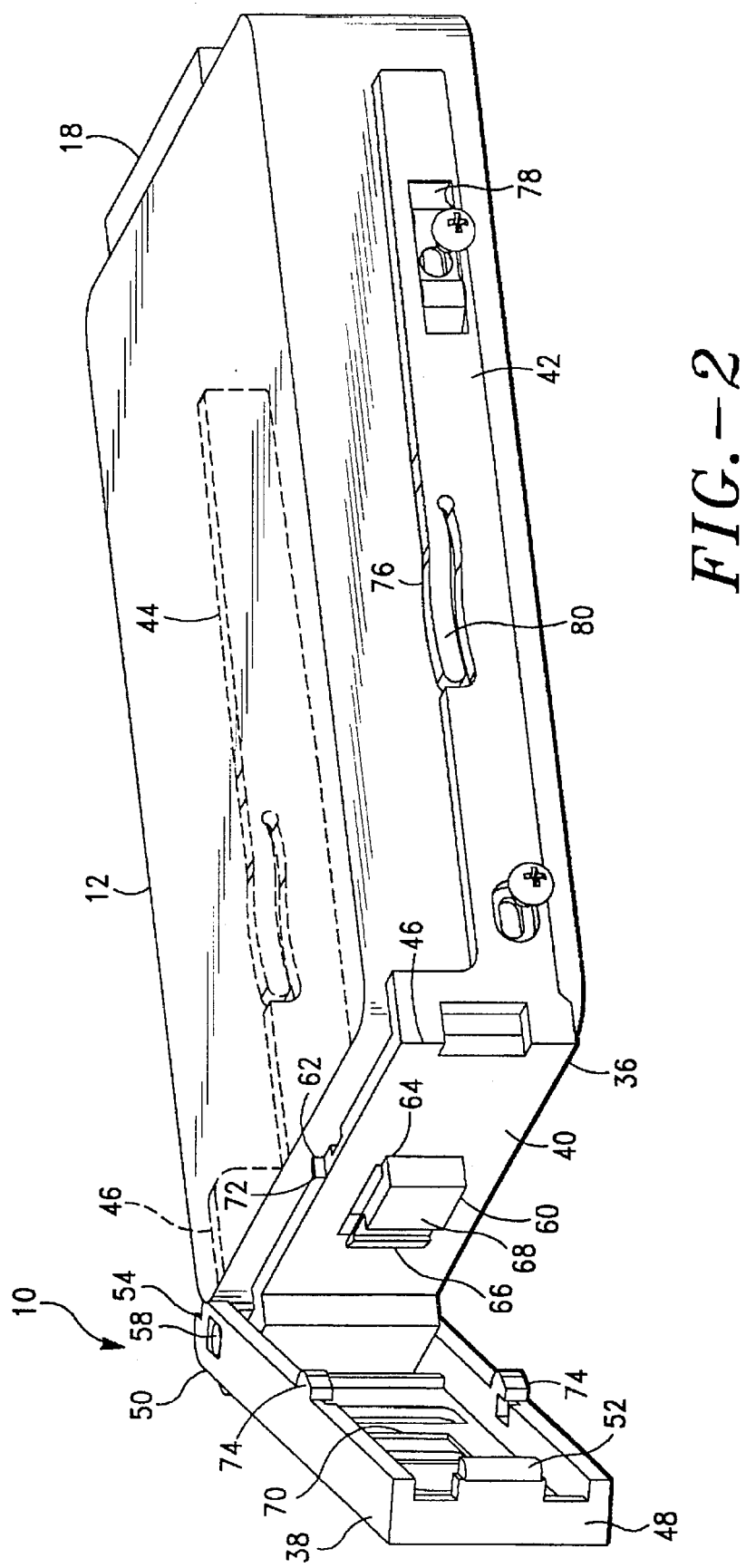
FIG. 2 is a perspective view of the bracket of FIG. 1 attached to a memory storage device.

With particular reference to FIG. 2, there is shown the bracket 10. The bracket 10 includes a frame 36 and a lever 38. The frame 36 includes a face member 40, a first rail 42 and a second rail 44. End of the rails 42 and 44 have ends 46. On the preferred embodiment, the face member 40 and each of the rails 42 and 44 are formed integral with each other. The ends 46 of each of the rail 42 and 44 attach to the face member 40. The memory storage device 20 bolts to each of the rails 42 and 44 along opposing lateral sides of the memory storage device 12. The rails 42 and 44 hold the memory storage device 12 with the bracket 10.

The lever 38 rotatably mounts on the face member 40. The lever 38 has a first end 48 and a second end 50. The first end 48 includes a latch 52. The second end 50 includes a notch 54. The notch 54 is configured for hooking the equipment slide 14 (FIG. 1) and for urging against the equipment slide 14 to eject the bracket 10 from the slide 14 in response to rotation of the lever 38. The latch 52 is configured for locking the face member 40 with the slide 14.

The face member 40 includes a fulcrum 58, a first lock 60 and a second lock 62. The lever 38 rotates about the fulcrum 58 between a first position wherein the lever 38 lies flush with the face member 40, and a second position where the lever 38 swings outward from the face member 40, extending at an oblique angle from the face member 40.

The first lock 60 includes a spring member 64, a latch 66 and a release 68. The spring member 64 normally urges the latch 66 against the lever 38 when the lever 38 lies flush with the face member 40. The lever 38 has an internal recess 70. The lever 38 is laterally slidable with respect to the face member 40. The latch 66 locks with the internal recess 70 to prevent the lever 38 from sliding laterally with respect to the face member 40 when the lever 38 lies flush with the face member 40.

The release 68 depresses the latch 66 and flexes the spring member 46 to unlocks the latch 66 from the lever 38. Depression of the release 68 enables the lever 38 to slide with respect to the face member 40.

The second lock 62 includes at least one pin 72 attached to the face member 40 and at least one detent 74 attached to the lever 38. The detent 74 slidably hooks the pin 72 to restrict rotation of the lever 38 with respect to the face member 40. It can be appreciated that the pin 72 and the detent 74 engage when the lever 38 lies flush with the face member 40.

Each of the rails 42 and 44 are rigid and elongated to slidably mate with an equipment slide. Each of the rails 42 and 44 includes a ground spring 78 and a rail spring 76. The ground spring 78 electrically grounds memory storage device 12 to the bracket 10. Accordingly, the bracket 10 grounds with the equipment slide 14 (FIG. 1). Grounding the memory storage device 12 minimizes the risk of damage due to electrostatic discharge.

The rail spring 76 is formed integral with each of the rails 42 and 44. The rail spring 76 tensions the rails 42 and 44 when the rails mate with the equipment slide 14 (FIG. 1). The rail spring 76 includes a finger 80 having a curved surface. The curved surface eases the rail spring 76 into a secure position on the equipment slide. The rail spring 76 dampens vibrations between the equipment slide 14 and the memory storage device 12.

Figure 3:
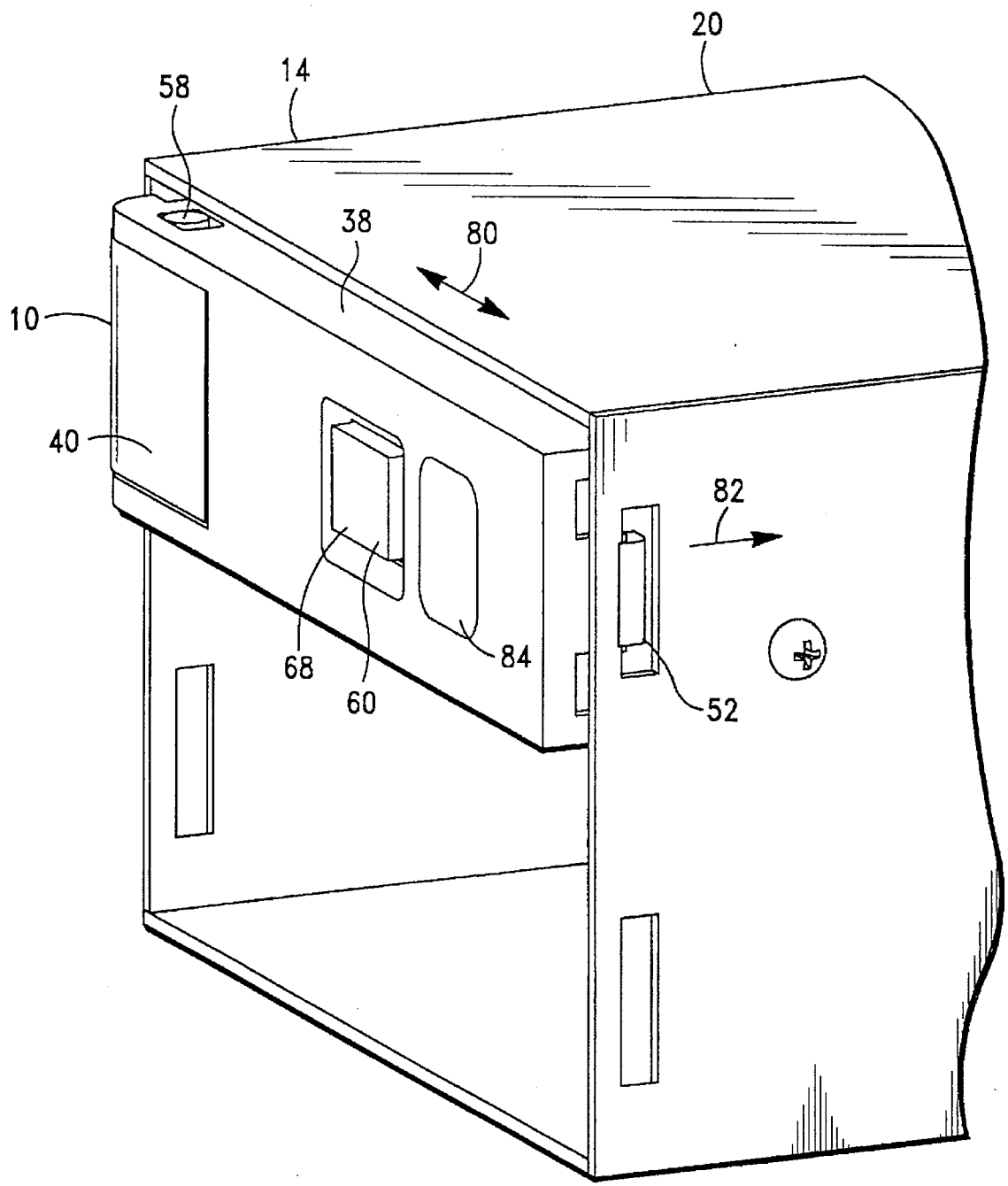
FIG. 3 is a perspective view of the bracket attached to a memory storage device housing.

With particular reference to FIG. 3, there is shown the bracket 10 inserted into the equipment slide 14. The lever 38 lies flush with the face member 40. The lever 38 slides laterally with respect to the face member 30 in the direction of the arrows 80. As shown, the lever 38 is slid fully towards the rail 42 (FIG. 1).

The latch 52 extends beyond the face member 40 and hooks the equipment slide 14. The latch 52 holds the lever with the equipment slide 14 and prevents rotation of the lever 38. The latch 52 presses against the slide 14 and urges the bracket 10 into the equipment slide 14 in the direction of the arrow 82. The first locking member 60 is spring biased to push the lever 38 away from the face member 40 to enable the latch 52 to urge the bracket 10 into the slide 14. Urging the bracket 10 into the slide 14 with the latch 32 stabilizes the electrical connection between the connectors 18 and 30 (FIG. 1). Stabilization of the electrical connectors 10 and 30 aids minimization of communication faults between the memory storage device 12 and a host system.

Depression of the release 68 enables the lever 38 slide laterally along the face member 40 towards the second rail 44 (FIG. 1). The lever 38 includes a grip 84. The grip 84 includes a recession. The grip 84 enables an operator to slide the lever 38 in the direction of the arrow 80.

When the release 68 is depressed and the lever 38 slides towards the second rail 44 (FIG. 1), the latch 52 releases from the equipment slide 14 to release the lever 38 from the equipment slide 14. Sliding the lever 38 towards the rail 44 enables the lever 38 to rotate about the fulcrum 58. Rotation of the lever 38 around the fulcrum 58 ejects the bracket 10 from the equipment slide 14.

Figure 4:
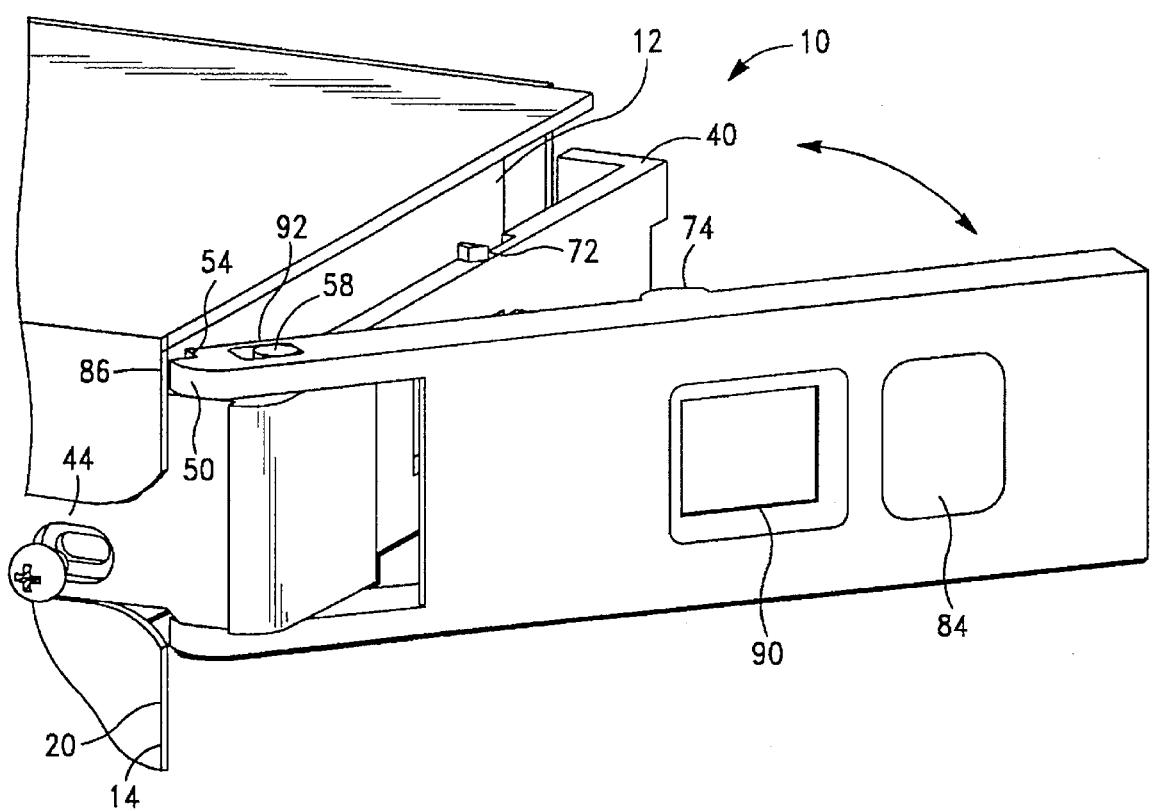
FIG. 4 is a perspective view of the invention of FIG. 3 with the lever rotated at an oblique angle from the face member of the bracket.

With particular reference to FIG. 4, there is shown the bracket 10 and the equipment slide 14. The equipment slide 14 has an edge 86. The lever 38 slides towards the rail 44. When the lever 38 slides towards the rail 44, the end 50 of the lever 38 extends towards the rail 44 and towards the edge 86 of the equipment slide 14. When the lever 38 rotates, the end 50 of the lever 20 engages the edge 86 of the equipment slide 14 and pushes against the equipment slide 14. The notch 54 guides the end 50 against the equipment slide 14 and engages the edge 86 of the equipment slide 14 to eject the bracket 10 and the memory storage device 12 from the equipment slide 14. Ejection of the memory storage device 12 from the equipment slide 14 occurs as a result of the end 50 of the lever 38 pressing against the equipment slide 14.

The lever 38 includes an opening 90. The opening 90 enables access to the release 68 (FIG. 2). The opening 90 is sized to enable the lever 38 to slide over the release 68.

The lever 38 includes an slot 92. The slot 92 is oblong in shape to slide over the fulcrum 58. Preferably, the slot 90 is shaped as an ellipse. The fulcrum 58 includes a cylindrical shaft which inserts into the slot 92. It will be appreciated that the fulcrum 58 extends beyond the face member 40 both above and below the face member 40.

While the foregoing detailed description has described a preferred embodiment of the bracket having a lever in accordance with this invention, it is to be understood that the above description is illustrative only and not limiting of the disclosed invention. In fact, various modifications of the bracket are possible. Such modifications may include, among others, altering the way the bracket urges the memory storage device against the pin connectors of the housing. Additionally, the configuration of the lever may be altered, or the way in which the lever removes the bracket from the memory storage device may be changed. Accordingly, the invention as disclosed is to be limited only by the claims as set forth below.

What is claimed is:

1. A bracket for removeably attaching a memory storage device to an equipment slide having an electrical connector, comprising:

a frame attachable to the memory storage device, the frame including a face member, a first rail and a second rail, each rail has one end attached to the face member; and a lever rotatably mounted on the face member, the lever has a first end and a second end, the second end urges against the equipment slide to eject the memory storage device from the equipment slide in response to rotation of the lever, the lever slidably mounts on the face member, the first end locks the bracket with the slide when the lever slides with respect to the face member, whereby, when the bracket attaches the memory storage device in the equipment slide and the lever rotates, the lever urges against the equipment slide to eject the memory storage device from the equipment slide.

2. An apparatus as set forth in claim 1, wherein the memory storage device electronically attaches with the electrical connector and mechanically attaches with the equipment slide, the first end of the lever urges against the equipment slide to stabilize the electrical connection between the memory storage device and the electrical connector.

3. An apparatus as set forth in claim 1, wherein the lever slidably mounts on the face member from a first position to a second position, in the first position the first end locks the face member to the equipment slide and urges the memory storage device against the equipment slide, in the second position first end unlocks from the equipment slide.

4. An apparatus as set forth in claim 1, wherein the lever slidably mounts on the face member and slides between a first position to a second position, in the first position the first end of the lever locks the bracket with the equipment slide, in the second position, the first end of the lever unlocks the bracket from the equipment slide.

5. An apparatus as set forth in claim 4, wherein the first end of the lever includes a latch which slides with the lever to lock the face member with the equipment slide.

6. An apparatus as set forth in claim 4, wherein the face member includes a first locking member, the first locking member locks the lever in the first position to hold the lever from sliding.

7. An apparatus as set forth in claim 6, wherein the first locking member includes a release and a spring member, the spring member normally urges the first locking member against the lever, the release unlocks the first locking member to enable the lever to slide.

8. An apparatus as set forth in claim 4, wherein the lever has a second locking member, the second locking member restricts rotation of the lever when the latch locks with the equipment slide.

9. An apparatus as set forth in claim 8, wherein the second locking member includes a detent attached to the lever, the detent slidably hooks the face member to restrict rotation of the lever.

10. A bracket for removeably attaching a memory storage device in an equipment slide, comprising:

a frame having a face member and a pair rails, each rail has one end attached to the face member, each rail being attachable to the memory storage device to slidably attach the memory storage device to the equipment slide;

a fulcrum attached to the face member;

a lever mounted on the fulcrum, the lever rotates to eject the memory storage device from the equipment slide and the lever slides to lock the frame with the equipment slide; and a locking member attached to the lever, the locking member selectively locks the face member with the equipment slide and urges the face member against the equipment slide when the lever slides, whereby, the lever slides to lock the bracket with the equipment slide and rotates to remove the bracket from the equipment slide.

11. An apparatus as set forth in claim 10, wherein each rail includes a ground spring for grounding each rail to the equipment slide when the bracket attaches a memory storage device to the equipment slide.

12. An apparatus as set forth in claim 10, wherein the locking member includes a spring and a button, the lever includes an opening for exposing the button, the button selectively compresses the spring to unlock and release the locking member.

13. An apparatus as set forth in claim 10, wherein the lever includes a recess, the recess enables an operator to grip the lever and slide the lever along the face member.

14. An apparatus as set forth in claim 10, wherein the fulcrum includes a shaft having ends, the lever has a forked end which attaches to each end of the fulcrum.

15. An apparatus as set forth in claim 10, wherein each rail includes a spring member for applying pressure between each rail and the equipment slide to hold the rails with the equipment slide.

16. An apparatus as set forth in claim 15, wherein the spring member includes a finger aligned with each rail, each finger flexes in response to insertion of the bracket into an equipment slide to hold the bracket in the equipment slide.

* * * * *